United States Patent [19]

Drechsel et al.

[11] Patent Number: 5,180,562
[45] Date of Patent: Jan. 19, 1993

[54] APPARATUS FOR PULLING MONOCRYSTALS

[75] Inventors: Dieter Drechsel, Bruchkoebel; Karl Jericho, Hanau, both of Fed. Rep. of Germany

[73] Assignee: Leybold Aktiengesellschaft, Cologne, Fed. Rep. of Germany

[21] Appl. No.: 359,032

[22] Filed: May 30, 1989

Related U.S. Application Data

[63] Continuation of Ser. No. 127,205, Dec. 1, 1987, abandoned.

[30] Foreign Application Priority Data

Oct. 3, 1987 [DE] Fed. Rep. of Germany ....... 3733487

[51] Int. Cl.$^5$ ............................................. C30B 15/14
[52] U.S. Cl. .................... 422/429; 156/605; 156/607; 156/617.1; 156/DIG. 115
[58] Field of Search ................ 422/249; 136/605, 607, 136/617.1, 618.1, 619.1

[56] References Cited

U.S. PATENT DOCUMENTS

| | | | |
|---|---|---|---|
| 2,892,739 | 6/1959 | Rusler | 156/605 |
| 3,359,077 | 12/1967 | Arst | 422/249 |
| 4,036,595 | 7/1977 | Lorenzini et al. | 422/249 |
| 4,410,796 | 10/1983 | Wilsey | 156/619.1 |
| 4,610,754 | 9/1986 | Gaida et al. | 156/619.1 |
| 4,650,540 | 3/1987 | Stoll | 156/619.1 |
| 4,659,421 | 4/1987 | Jewett | 156/605 |
| 4,698,120 | 10/1987 | Higginbotham | 156/617.1 |
| 4,734,267 | 3/1988 | Kojima | 156/607 |

FOREIGN PATENT DOCUMENTS

| | | | |
|---|---|---|---|
| 0141649 | 5/1985 | European Pat. Off. | 422/249 |
| 2245250 | 3/1974 | Fed. Rep. of Germany | 156/617.1 |
| 2752308 | 5/1978 | Fed. Rep. of Germany | 156/619.1 |
| 3506754 | 8/1986 | Fed. Rep. of Germany | 422/249 |
| 2013820 | 4/1970 | France | 156/617.1 |
| 60-027683 | 12/1985 | Japan | 422/249 |
| 1095587 | 12/1967 | United Kingdom | 156/677.1 |

OTHER PUBLICATIONS

Whiffin et al., The Supression of Thermal Oscillations in Czochralski Growth, Journal of Crystal Growth, vol. 10, No. 1 (1971) pp. 91-96.

Marshall et al, An Improved Czochralski Crystal-Pulling Furnace, Journal of Scientific Instruments, vol. 35, Apr. 1955 pp. 121-125.

*Primary Examiner*—Robert Kunemund
*Attorney, Agent, or Firm*—Felfe & Lynch

[57] ABSTRACT

Apparatus includes a crucible, a cover with an opening over the crucible, a pulling element for pulling monocrystal from melt in the crucible, and first and second heating elements. The first element is a substantially flat radiaent heat source below the crucible and the second element is a pot shaped, comprising a flat heat source above the melt and a cylindrical heat source about the crucible. A ring having holes therethrough is inserted in the crucible to quiet the melt, a filler funnel emptying material to be molten outside of the ring while the monocrystal is pulled from inside the ring.

13 Claims, 4 Drawing Sheets

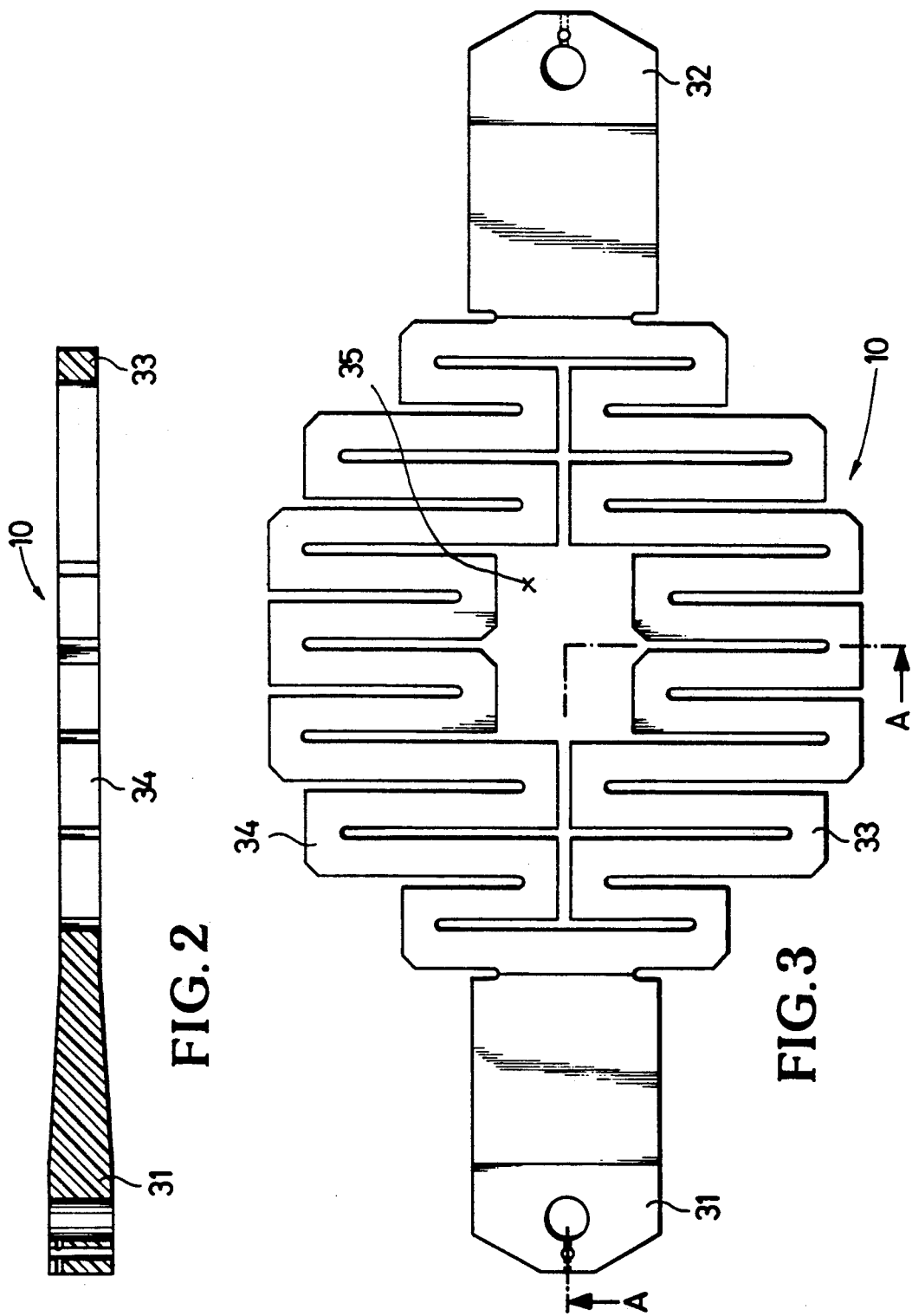

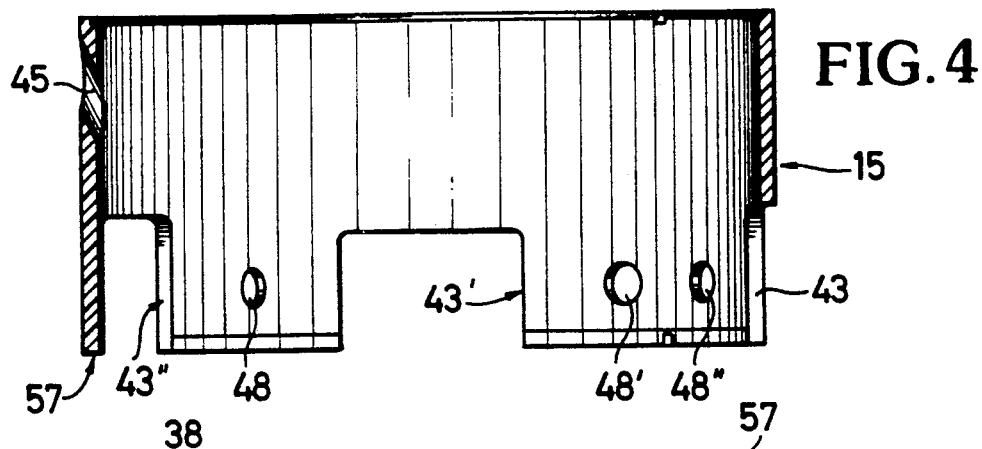
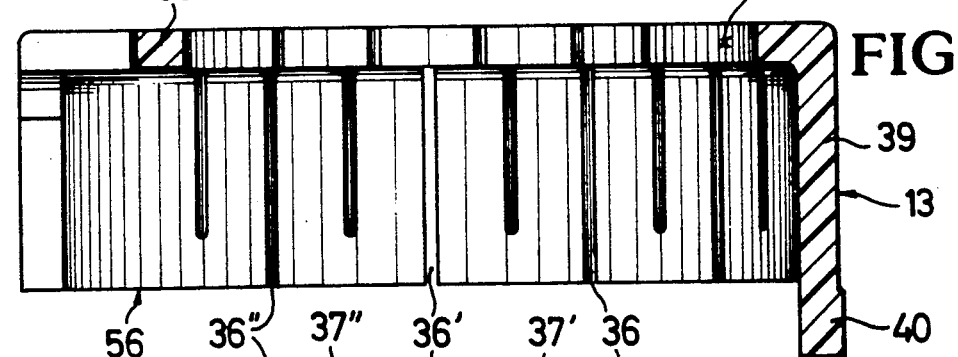
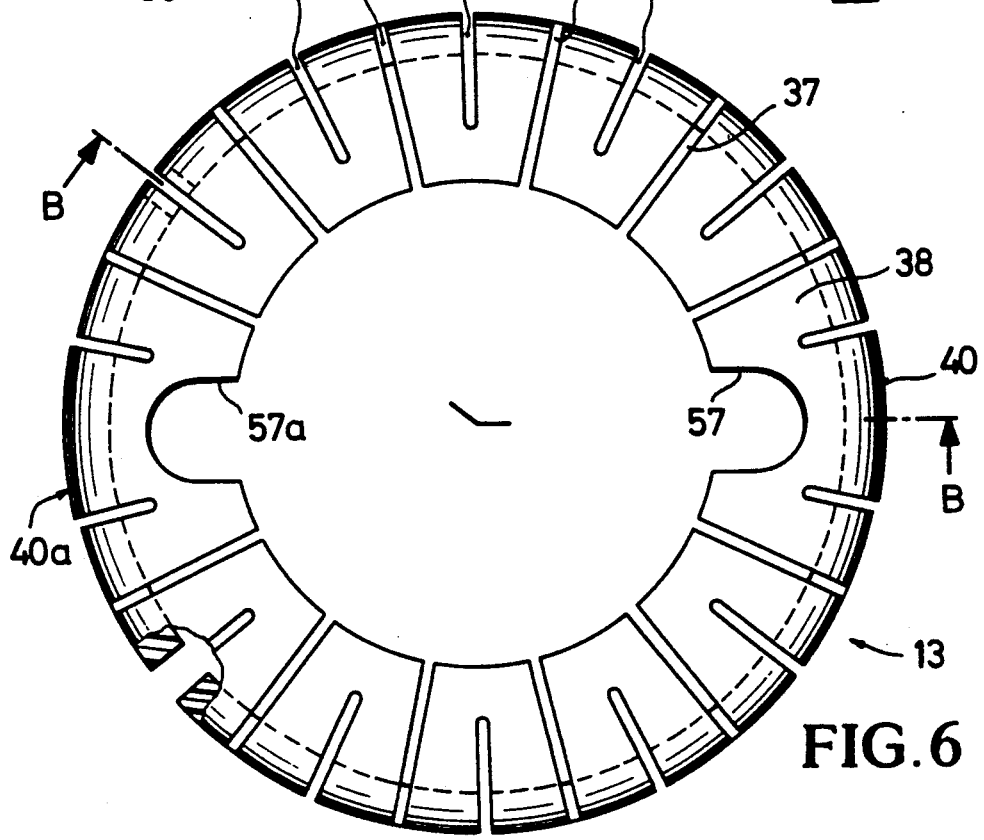

APPARATUS FOR PULLING MONOCRYSTALS

This is a Rule 60 Continuation of parent application Ser. No. 127,205, filed Dec. 1, 1987, now abandoned.

BACKGROUND OF THE INVENTION

The invention relates to an apparatus for pulling monocrystals out of a melt situated in a crucible under vacuum. The apparatus has a vacuum chamber in which the crucible is disposed, a means for heating the melt, a pulling means above the melt, and a cover having an opening and situated above the melt through which the monocrystal can be pulled upwardly from the surface of the melt.

When monocrystals are pulled from a melt under vacuum conditions it is very important to keep the temperature ratios at the crucible margin as low as possible and prevent flows from forming in the melt.

To counteract disadvantageous effects in the pulling of monocrystals in a known apparatus for pulling monocrystals (U.S. Pat. No. 3,359,077 to Arst) a cover has already been used over the melt to reduce the thermal gradient at the surface of the melt.

It is furthermore known (EU-0 170 856) to make the crucible for the melt bipartite and provide it with a cylindrical insert and arrange the charging funnel of a recharging apparatus such that the recharging material can be poured into a marginal portion remaining between the margin of the inner shell of the crucible and the insert. This known apparatus is equipped with two heaters of which one has a flat, discoidal configuration and is held underneath the crucible, and the other is in the form of a hollow cylindrical body surrounding the crucible.

Lastly, an apparatus (U.S. Pat. No. 3,511,610) is already known which serves to reduce any excessively great temperature difference between the end of the seed crystal and the melt, the part bearing the seed crystal being provided with a heating means by which the heat can be transferred to the seed crystal with the aid of the carrier of the latter. This purpose is served by a plate on the element that pulls up the crystal holder.

SUMMARY OF THE INVENTION

The present invention has the object of improving the melting of the continuously fed charge material, to prevent any great agitation of the bath by the charging during the pulling, and to prevent increases in the temperature of the crucible wall caused by the passage through it of energy for melting the added charge material.

This object is achieved by an approximately annular, flat first heater body extending in a plane parallel to the bottom surface of the crucible, and a substantially cylindrical second heater body at least partially surrounding the crucible and disposed so as to be perpendicular to the plane of the first heater body, which merges at its upper end with an approximately plate-like heater body parallel to the first heater body, which is disposed in a plane between the upper margin of the crucible and the bottom of the annular covering.

The plate-like portion of the second heating body which is constructed in the manner of a flange and at least partially covers the melt, permits direct heating of the added material without exposing the crucible as a whole to heating.

Instead of a cylindrical second heater equipped with an annular, flat portion, a substantially discoidal, flat second heater can also be provided whose thin annular portion is disposed in a plane between the upper margin of the crucible and the bottom of the annular cover, the thin annular portion having one or more heater feet extending perpendicularly downward, which engage in recesses which are provided on the clamping jaws, the heater feet being clamped, wedged or screwed into the recesses.

The power supply both of the first heater body (the one heating or temperature-controlling the crucible) and of the second heater body (the one acting directly on the charge material) is best separate for each, since the heating power of the second heater body depends directly on the amount of additional charge put in per unit time.

Preferably the plate-like first heater body is held by at least two rod-like power feeders disposed parallel to the crucible supporting column, the power feeders being on the one hand brought through the bottom plate of the pot with insulation, and on the other hand being fastened to the feet of the first heater body.

The feet of the first heater body, which are affixed to the power feeders, are bound together through two substantially semicircular portions. These portions, which include a central opening, are formed of serpentinely configured heater coils.

To advantage, the annular, flat portion of the cylinder-shaped second heater body is provided with a plurality of slots distributed on its circumference, which extend all the way into the area of the cylindrical wall. Alternatively or additionally the wall of the substantially cylindrical second heater body is equipped with a plurality of slots distributed on the circumference of the wall, which extend inwardly from the bottom edge of the heater body into the area of the annular flat portion extending radially inward.

The wall of the second heater body is best provided with downwardly extending feet which are engaged in recesses which are provided on radially inwardly extending clamping jaws held by the power feeders, the foot portions of the second heater body being wedged in the more or less rectangular recesses with the aid of wedges, or being screwed or riveted therein.

To assure the continuous feeding of the charge material, the annular, flat portion of the cylindrical second heater body has openings or holes through which the filler funnel of a filler tube of the charging apparatus reaches, which is provided outside of the pot.

Preferably the crucible and the two heater bodies are at least partially surrounded by a substantially cylindrical guard tube which rests with its bottom margin, provided with openings, on a molten material catching pan which in turn is held on the bottom plate of the pot by a tube, the molten material catching pan extending in a plane parallel to the plane of the bottom surface of the crucible and having a central bore through which the vertical crucible holding column is passed.

To assure a uniform distribution of heat with low heat losses, both the pan for catching the molten material in the event of crucible breakage, and the guard tube, and the cover plate disposed over the crucible and borne by the guard tube is clad with insulating material mats, preferably of graphite felt.

To prevent agitation of the melt, a hollow cylindrical ring concentrically placed i the melting crucible and provided with openings or break-throughs for the passage of the melt, and made from a material that does not react with the melt, is provided, the filler funnel bringing in the charge material emptying in an area which is defined by the outside surface of the ring and the margin of the crucible.

Contamination of the melt is also prevented by the fact that the inner wall of the crucible is provided with a dish or an insert of a material which does not react with the melt, and that at least the annular, flat portion of the second heater body disposed above the crucible is coated.

The invention admits of a great variety of embodiments, one of them being shown in the appended drawings, wherein

BRIEF DESCRIPTION OF THE DRAWINGS

FIGS. 2 and 3 are a plan view of the bottom heater according to FIG. 1, and a cross section through the latter along lines A—A FIG. 4 shows the radiation guard tube laterally surrounding the melting crucible and the heater FIGS. 5 and 6 are a top view of the cylindrical heater according to FIG. 1 and a longitudinal section taken along lines B—B

DETAILED DESCRIPTION OF THE PREFERRED EMBODIMENT

Figure 1:
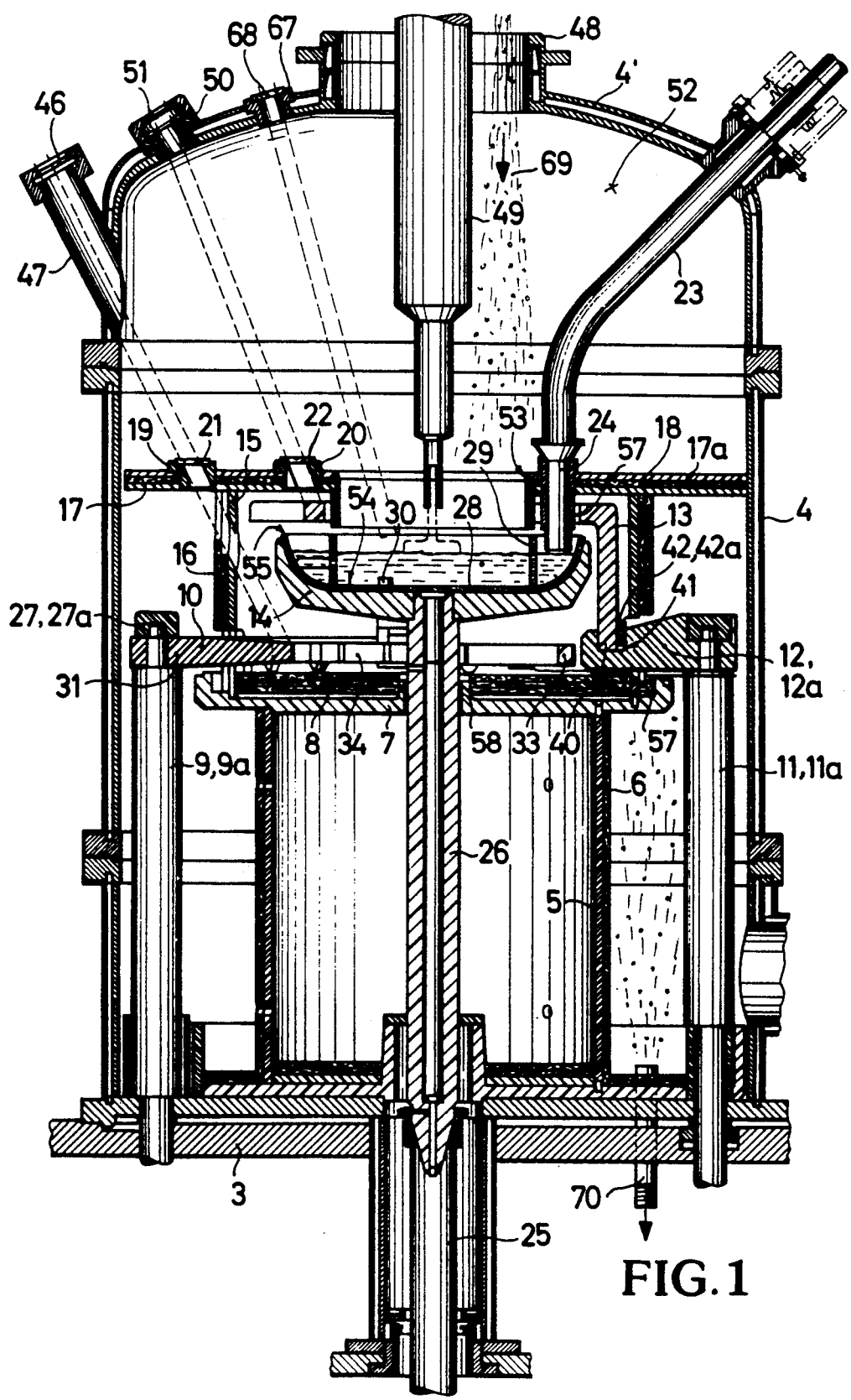
FIG. 1 is a longitudinal cross section through part of an apparatus for pulling monocrystals

The apparatus depicted in FIG. 1 of the drawing includes double-walled pot 4 which is placed on the also double-walled pot bottom 3 of the frame of the apparatus and forms a vacuum chamber 52. A supporting tube 5 is disposed in the pot 4 and mounted on the pot bottom 3 has a thermal insulation 6 enveloping the tube. An annular pan 7 held by the supporting tube 5 has graphite felt plates 8 mounted in the pan. Two power feeders 9 and 9a held on the pot bottom 3 feed a bottom heater 10 held above the pan 7, and two additional power feeders 11 and 11a on which clamps 12 and 12a are screwed feed a top end or cylindrical heater 13 borne by the clamps. A radiation guard tube 15 is supported on the pan 7 and provided with thermal side insulation 16, and a cover plate 17 borne by the radiation guard tube 15 has an upper end thermal insulation 18 and feedthroughs 19 and 20 with protective glasses 21 and 22. A tube 23 feeds charge material to crucible 14 through a filler funnel 24 brought through the cover plate 17 and 17a. The crucible column 25 which is rotatable and movable upward and downward for holding the crucible supporting column 26.

The bottom heater 10 held by the two electric power feeders 9 and 9a is represented in FIGS. 2 and 3 and consists of the two lateral heater feet 31 and 32 situated opposite one another, and the two serpentine heating coils 33 and 34. The heating coils 33 and 34 together form in the center of the bottom heater 10 an opening 35 through which the crucible supporting column 26 extends, which is affixed at its upper end to the melting crucible and by which the melting crucible 14 can be both moved up and down and made to rotate. The top end heater 13 represented in greater detail in FIGS. 5 and 6 is formed by an annular, flat part 38 provided with radially disposed slots 36, 36', . . . and 37, 37', . . . and a hollow cylindrical lateral wall 39. The hollow cylindrical portion 39 is provided on two portions lying opposite one another with downwardly extending heater feet 40, 40a, which are engaged in recesses 41 and 41a, respectively, which are provided in the two clamps 12, 12a, held by the current feeders 11 and 11a. In order to assure a reliable passage of current to the top end heater 13 in the two recesses 41 and 41a of the clamps 12 and 12a, additional wedges 42 and 42a are driven into the trapezoidal recesses 41 and 41a.

The radiation guard tube 15 represented in FIG. 4 has four rectangular openings 43, 43', . . . which are uniformly distributed on the circumference of the radiation guard tube 15, and disposed on its bottom margin 57. The clamps 12 and 12a on the one hand and the heater feed 31, 32, of the bottom heater 10 on the other, are brought out through these openings 43, 43', . . . Furthermore, the radiation guard tube 15 is provided with a sloping bore 45 which is aligned with the protective glass 21 of the cover plate 17 and 17a and the protective glass 46 of the pipe nipple 47 fastened in the wall of the pot 4. Additional openings 48, 48', 48", . . . in the side wall of the radiation guard tube 15 permit an unhampered passage of gas from the upper section of the interior of the pot 4 into the bottom section. The pot 4 is furthermore provided in the area of its cover 4' with a collar 48 which permits the entry of the puller 49. It is also to be noted that an additional pipe nipple 50 with a viewing glass 51 is also present in the cover 4' of the pot.

The bottom heater 10, which is slotted to give it a serpentine pattern, is screwed by two graphite nuts 27 and 27a to the two feeders 9 and 9a. The bottom heater 10 has the purpose of heating the crucible and the melt therein from the bottom. A second heater 13, which is constructed as a top heater, is fastened by clamps 12 and 12a to two additional power feeders 11 and 11a, the top surface heating improves the melting of the continuously fed charge material. The top surface heater 13 can, in the case of a silicon melt, be coated or shielded with silicon carbide to prevent graphite particles from dropping into the melt resulting in carbon contamination. Any reaction of SiO with graphite (2C+SiO→SiC+CO) is also prevented. The irregular broken lines indicate an argon gas stream which flows downwardly through the collar 48 through the central opening 53, and over the melt and around the crucible 14 through the holes 48, 48', . . . , and is finally withdrawn through the pipe nipple 70.

In the center of the heating system is a graphite crucible 14 into which is inserted a crucible 28 which is formed from a material that does not react with the melt. To assure quieting of the bath when it is charged during the pulling process, an additional ring 29, which is also formed from a material that does not react with the melt, is inserted into the crucible 28. At the bottom end of the ring 29 are openings or break-throughs 30 through which the molten material can flow into the center of the crucible insert 28. A thermal barrier 8, 16, 18 is placed around both heaters 10 and 13, and consists of the pan 7, additional graphite felt plates 8, a lateral thermal barrier 16 in the form of a cylinder fitted over the radiation guard tube 15, and a top end thermal barrier 18. The top plates 17 and 17a rest, together with the thermal barrier 18, on the inside surface of the pot 4.

Figure 7:
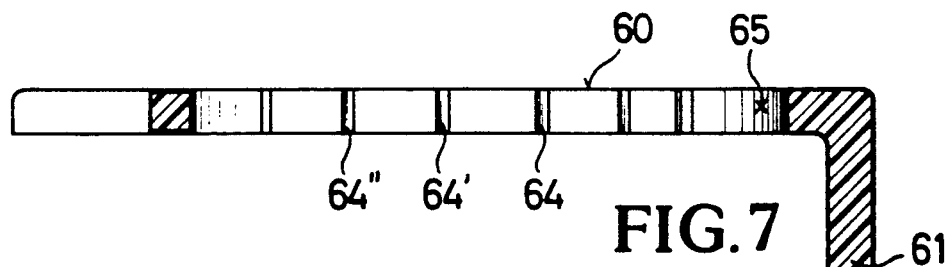
FIGS. 7-9 are different views of an alternative annular, flat heater.
Figure 8:
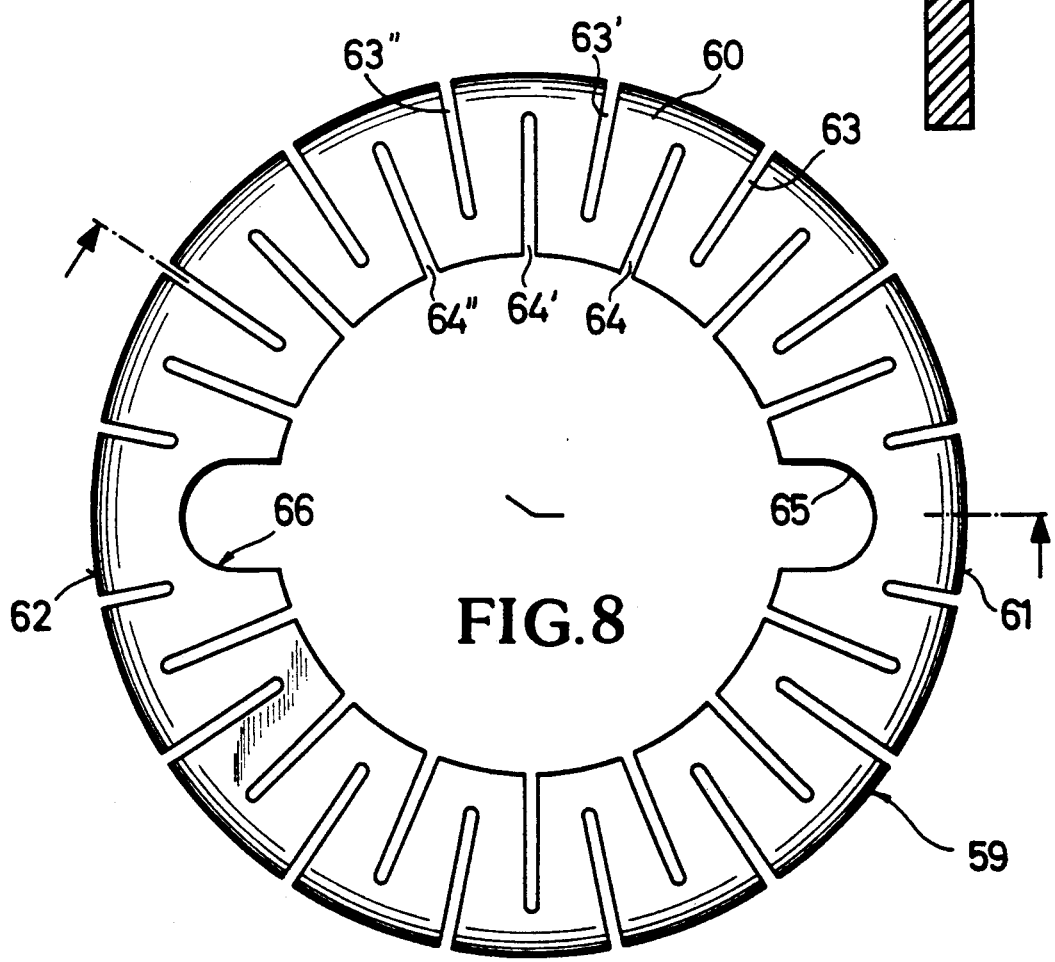
Figure 9:
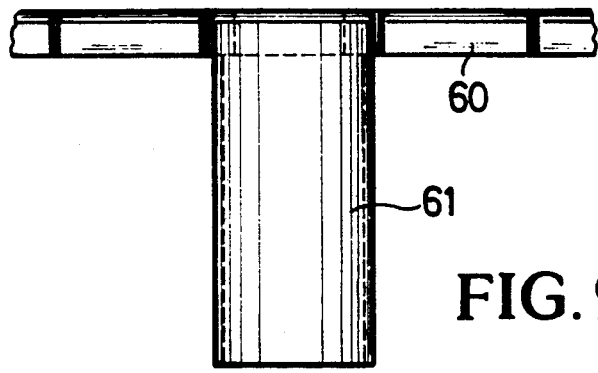

In FIGS. 7 to 9 there is represented a heater 59 which can be used as an alternative to the second heater. This heater 59 consists essentially of an annular, flat, serpentinely slotted piece 60 having two heater feet 61 and 62 disposed at right angles to the piece. FIG. 8 depicts a top view of heater 59 showing the flat portion 60 of the second heater body 59, has a plurality of radially extending slots (63, 63', 62", 64', 64") and, as is shown in FIG. 9, is provided with at least one heater foot 61 and/or 62 (extending perpendicularly downward from the margin of the flat portion 60. The second heater body 59 has openings or holes 65, 66 through which the filler funnel 24, as shown in FIG. 1, of a feed tube 23 (shown in FIG. 1) of a charging apparatus extends. The temperature of the heater 59 can be established individually, and for this purpose the temperature of the melt in the crucible 14/28 can be measured through the nipple 67 in the cover of the pot 4. When unmelted material is fed through the filling funnel 24 into the melt in the crucible 14/28, an immediate and rapid melting of this added material can be produced by the two heaters alone (FIGS. 4 to 6 and FIGS. 7 to 9), and this can be done with a comparatively minimal agitation of the melt, and also without more greatly heating the crucible 14/28 itself.

We claim:

1. Apparatus for pulling monocrystal from a melt, comprising:
   a vacuum chamber;
   a melting crucible in said chamber, said crucible having a bottom surface and an upper margin;
   pulling means above said crucible for pulling monocrystal from a melt therein;
   a cover above the upper margin of the crucible and having a central opening through which monocrystal is pulled;
   a first heating element comprising a substantially flat first radiant heat source below the bottom surface of said crucible and having a central opening to accommodate support means for said crucible; and
   a second heating element comprising a plate-like second radiant heat source parallel to said first radiant source and lying between the cover and the upper margin of said crucible and having a central opening through which monocrystal is pulled, the second heating element acting directly on the surface of the melt to maintain the monocrystal in a molten state in the crucible.

2. Apparatus as in claim 1 wherein said second heating element further comprises a substantially cylindrical heat source at least partially enveloping said crucible and having a top edge which merges with said second radiant heat source to form a pot shaped top heater.

3. Apparatus as in claim 1 wherein said second heating element comprises at least one heater foot which extends downward perpendicularly to said second radiant heat source, said apparatus further comprising at least one recess in which respective heater feet are engaged.

4. Apparatus as in claim 1 wherein said support means for said crucible comprises a support column extending through said central opening in said first radiant heat source, said apparatus further comprising a plurality of rod-like power feeders disposed parallel to the support column, said feeders being connected to said first heating element.

5. Apparatus as in claim 4 wherein said first heating element comprises a pair of feet extending outward from said first radiant heat source, said feet being connected to said power feeders, said first radiant heat source comprising a pair of serpentine heating coils defining said central opening of said first heating element herebetwen.

6. Apparatus of claim 2 wherein said second radiant heat source comprises a plurality of slots extending radially outward from said central opening of said second heating element, said slots extending downward into said cylindrical heat source but not to the bottom edge thereof.

7. Apparatus as in claim 3 wherein said second radiant heat source comprises a plurality of further slots extending upward from the bottom edge of said cylindrical heat source and into said second radiant heat source but not to said central opening, said further slots alternating with the slots extending outward from the central opening.

8. Apparatus as in claim 3 further comprising power feeders holding clamp jaws in which said recesses are provided.

9. Apparatus as in claim 1 further comprising a cylindrical ring, which does not react with the melt, situated int the crucible and having holes therethrough for passage of the melt.

10. Apparatus as in claim 1 further comprising a feed tube for providing additional charge to the crucible, said second radiant heat source having opening means for accommodating said feed tube therethrough, said feed tube adding charge outside of the ring while said monocrystal is pulled from inside the ring whereby additional charge may be added to said crucible while molten monocrystal is being pulled therefrom.

11. Apparatus as in claim 2 further comprising a radiation guard tube at least substantially surrounding said first radiant heat source, said second radiant heat source, and said cylindrical heat source, said cover being carried on top of the guard tube.

12. Apparatus as in claim 11 further comprising a molten material catch pan below said crucible and having a central opening which closely receives said support means therethrough, said guard tube having a bottom margin on said catch pan.

13. Apparatus as in claim 12 wherein the catch pan, the guard tube, and the cover are clad with insulation.

* * * * *